US009487863B2

(12) United States Patent
Matsui et al.

(10) Patent No.: US 9,487,863 B2
(45) Date of Patent: Nov. 8, 2016

(54) SUBSTRATE PROCESSING APPARATUS (71) Applicant: HITACHI KOKUSAI ELECTRIC INC., Tokyo (JP)

(72) Inventors: Shun Matsui, Toyama (JP); Kazuhiro Morimitsu, Toyama (JP); Kazuyuki Toyoda, Toyama (JP)

(73) Assignee: HITACHI KOKUSAI ELECTRIC INC., Tokyo (JP)

( * ) Notice: Subject to any disclaimer, the term of this patent is extended or adjusted under 35 U.S.C. 154(b) by 0 days.

(21) Appl. No.: 14/810,996

(22) Filed: Jul. 28, 2015

(65) Prior Publication Data

US 2016/0230280 A1 Aug. 11, 2016

(30) Foreign Application Priority Data

Feb. 6, 2015 (JP) ................. 2015-022170

(51) Int. Cl.
    *C23C 16/50*    (2006.01)
    *C23C 16/46*    (2006.01)
    *C23C 16/52*    (2006.01)
    *C23C 16/458*   (2006.01)
    *C23C 16/455*   (2006.01)
    *C23C 16/44*    (2006.01)

(52) U.S. Cl.
    CPC ........... *C23C 16/46* (2013.01); *C23C 16/4412* (2013.01); *C23C 16/455* (2013.01); *C23C 16/458* (2013.01); *C23C 16/463* (2013.01); *C23C 16/52* (2013.01)

(58) Field of Classification Search
    CPC ..... C23C 16/46; C23C 16/52; C23C 16/463; C23C 16/4412; C23C 16/458; C23C 16/455
    USPC .............................. 118/715, 724; 156/345.37
    See application file for complete search history.

(56) References Cited

U.S. PATENT DOCUMENTS

| | | | | |
|---|---|---|---|---|
| 3,968,831 A * | 7/1976 | Xenophou | ............ | E04B 1/7612 165/53 |
| 5,857,307 A * | 1/1999 | Takemasa | ............... | E04B 1/803 52/404.4 |
| 5,935,337 A * | 8/1999 | Takeuchi | .......... | C23C 16/45565 118/715 |
| 6,875,407 B1 * | 4/2005 | Biel, Jr. | ............... | B01D 53/885 422/173 |
| 7,204,886 B2 * | 4/2007 | Chen | ................. | C23C 16/45502 118/715 |
| 7,780,789 B2 * | 8/2010 | Wu | ........................ | C23C 16/34 118/715 |
| 7,812,285 B2 * | 10/2010 | Hayashi | .................... | F27B 5/04 118/724 |
| 8,778,079 B2 * | 7/2014 | Begarney | .......... | C23C 16/45508 118/715 |
| 2003/0190423 A1 * | 10/2003 | Yang | ................. | C23C 16/45531 427/255.28 |
| 2004/0144311 A1 * | 7/2004 | Chen | ................. | C23C 16/45502 118/715 |

(Continued)

FOREIGN PATENT DOCUMENTS

| | | |
|---|---|---|
| JP | 11-40505 | 2/1999 |
| JP | 2004-063523 A | 2/2004 |

(Continued)

*Primary Examiner* — Rudy Zervigon
(74) *Attorney, Agent, or Firm* — Volpe and Koenig, P.C.

(57) ABSTRACT

A substrate processing apparatus includes: a process chamber configured to process a substrate; a substrate mounting stand installed in the process chamber and configured to hold the substrate; a heating part configured to heat the substrate; a gas rectifying part configured to supply a process gas to the substrate; a sealing part installed in the gas rectifying part; a heat insulating part installed between the sealing part and an upstream side surface of the gas rectifying part; and a first pressure adjusting part connected to the heat insulating part.

8 Claims, 7 Drawing Sheets

(56) References Cited

U.S. PATENT DOCUMENTS

| | | | | |
|---|---|---|---|---|
| 2004/0261946 | A1* | 12/2004 | Endoh | H01J 37/32082 156/345.15 |
| 2005/0003600 | A1 | 1/2005 | Kasai et al. | |
| 2005/0271562 | A1* | 12/2005 | Biel | B01D 53/9495 422/179 |
| 2006/0057021 | A1* | 3/2006 | Sawyer | A61L 2/24 422/26 |
| 2006/0213437 | A1* | 9/2006 | Ishizaka | C23C 16/4404 118/715 |
| 2006/0213438 | A1* | 9/2006 | Ishizaka | C23C 16/4404 118/715 |
| 2007/0044916 | A1* | 3/2007 | Isozaki | C23C 4/02 156/345.52 |
| 2009/0031659 | A1* | 2/2009 | Kalfon | E04B 1/803 52/404.1 |
| 2012/0085070 | A1* | 4/2012 | Chou | B65D 81/3802 53/408 |
| 2012/0111271 | A1* | 5/2012 | Begarney | C23C 16/45508 118/724 |

FOREIGN PATENT DOCUMENTS

| | | |
|---|---|---|
| JP | 3877656 B2 | 2/2007 |
| KR | 10-0754537 A | 9/2007 |

* cited by examiner

SUBSTRATE PROCESSING APPARATUS

CROSS-REFERENCE TO RELATED APPLICATION

This application is based upon and claims the benefit of priority from Japanese Patent Application No. 2015-022170, filed on Feb. 6, 2015, the entire contents of which are incorporated herein by reference.

TECHNICAL FIELD

The present disclosure relates to a substrate processing apparatus.

BACKGROUND

As an exemplary process of manufacturing a semiconductor device, a process of supplying a process gas and a reaction gas to a substrate to form a film on the substrate is often performed.

SUMMARY

A substrate may have uneven distribution of temperature, which may result in non-uniform processing.

Some embodiments of the present disclosure provide a technique to improve processing uniformity for a substrate.

According to one embodiment of the present disclosure, there is provided a technique including: a process chamber configured to process a substrate; a substrate mounting stand installed in the process chamber and configured to mount the substrate; a heating part configured to heat the substrate; a gas rectifying part configured to supply a process gas to the substrate; a sealing part installed in the gas rectifying part; a heat insulating part installed between the sealing part and an upstream side surface of the gas rectifying part; and a first pressure adjusting part connected to the heat insulating part.

DETAILED DESCRIPTION

Hereinafter, embodiments of the present disclosure will be described.

First Embodiment

Hereinafter, a first embodiment will be described with reference to the relevant drawings.

(1) Configuration of a Substrate Processing Apparatus

A substrate processing apparatus according to the first embodiment is described below.

A processing apparatus 100 according to the first embodiment will be described. The substrate processing apparatus 100 is for producing an insulating film, a metal film, etc., and is capable of processing one wafer at a time as shown in FIG. 1.

Figure 1:
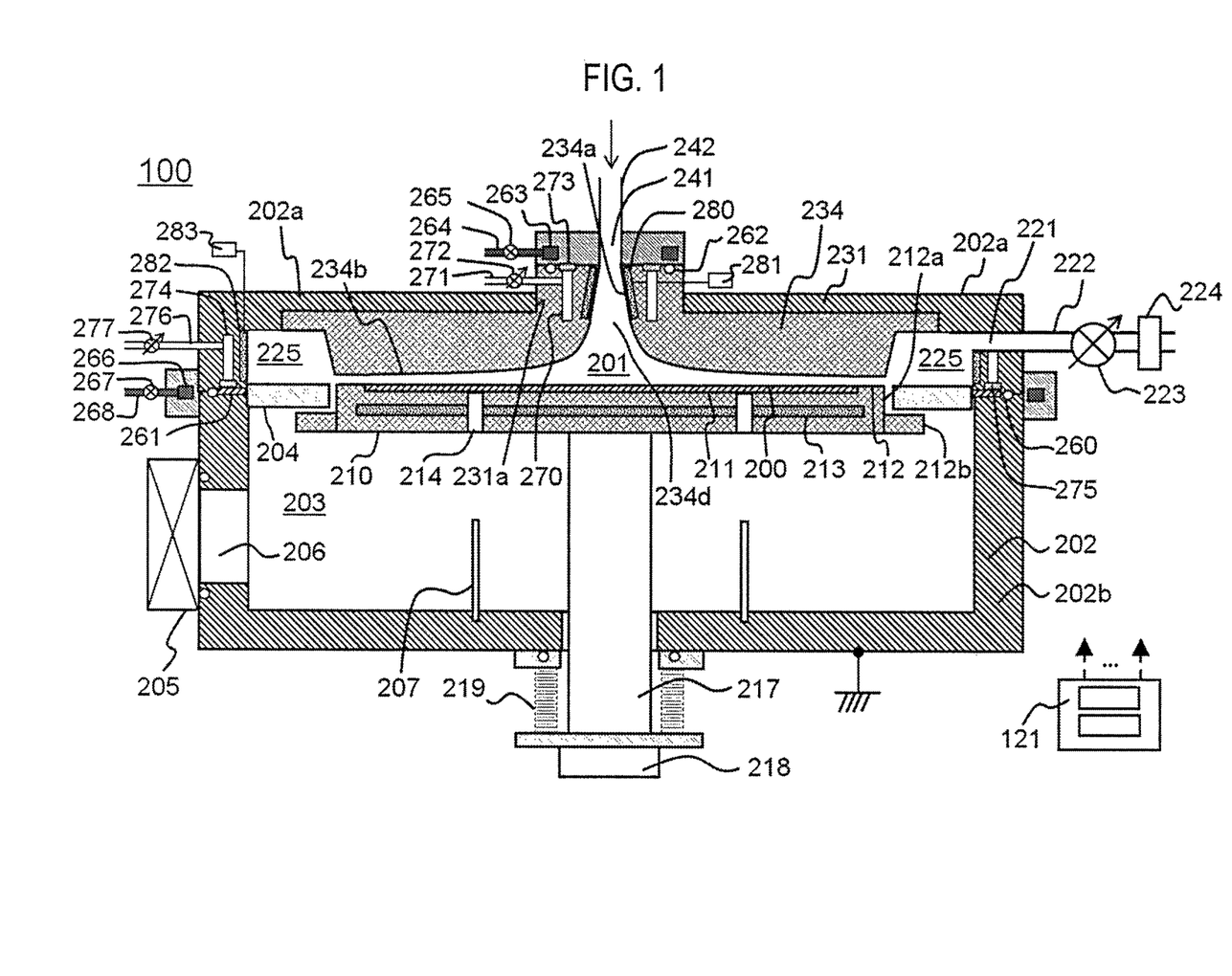
FIG. 1 is a diagram schematically illustrating the configuration of a substrate processing apparatus according to one embodiment of the present disclosure.

As shown in FIG. 1, the substrate processing apparatus 100 is provided with a process vessel 202. The process vessel 202 is configured, for example, as a flat airtight vessel having a circular horizontal cross section. In addition, the process vessel 202 is formed of, for example, metal material, such as aluminum (Al) or stainless steel (SUS), or quartz. A process space (process chamber) 201, in which a wafer 200 such as a silicon wafer as a substrate is processed, and a transfer space 203 are formed in the process vessel 202.

The process vessel 202 consists of an upper vessel 202a and a lower vessel 202b. A partition plate 204 is installed between the upper vessel 202a and the lower vessel 202b. A process vessel sealing part 260 is installed between the upper vessel 202a and the lower vessel 202b as a second sealing part for maintaining the pressure inside the process chamber 201 or the transfer space 203. Additionally, a buffer part 261 may be installed to keep the upper vessel 202a from coming in direct contact with the lower vessel 202b or keep the process vessel sealing part 260 from being deformed. The process vessel sealing part 260 and the buffer part 261 are made of a material having a lower heat resistance than that of the upper vessel 202a or the lower vessel 202b. For example, the process vessel sealing part 260 and the buffer part 261 are made of a material such as polytetrafluoroethylen (PTFE) as a fluorocarbon resin, a fluorocarbon rubber consisting mainly of a carbon element and fluorine element, a fluorocarbon rubber consisting mainly of carbon element, fluorine element, and oxygen element, etc. In addition, a seal member made of a metal material containing one of copper (Cu), stainless steel (SUS), aluminum (Al), etc., may be installed. The process vessel sealing part 260 may also be referred to as an O-ring or a gasket. The space above the partition plate 204 confined by the upper vessel 202a is referred to as the process chamber 201 or a reaction zone 201. The space below the partition plate 204 confined by the lower vessel 202b is referred to as the transfer space 203.

A substrate loading/unloading port 206 is formed in a side surface of the lower vessel 202b, adjacent to a gate valve 205. The wafer 200 moves into and out of a transfer chamber (not shown) through the substrate loading/unloading port 206. A plurality of lift pins 207 is installed in a bottom portion of the lower vessel 202b. In addition, the lower vessel 202b is referenced to the ground potential.

A substrate support part 210 for supporting the wafer 200 is installed in the process vessel 202. The substrate support part 210 includes, among others, a mounting surface 211 for holding the wafer 200, a substrate mounting stand 212 having the mounting surface 211 on a surface thereof, and a heater 213 as a heating part embedded in the substrate mounting stand 212. Through holes 214 are formed in the substrate mounting stand 212 each at a position corresponding to positions of the respective lift pins 207, so that the lift pins 207 penetrate into the through holes 214.

In addition, a protruding portion 212b is formed on a side wall 212a of the substrate mounting stand 212, which protrudes in the radial direction of the substrate mounting stand 212. The protruding portion 212b is formed closely to the bottom of the substrate mounting stand 212. The protruding portion 212b comes close to or in contact with the partition plate 204, thereby suppressing the atmosphere from moving from the process chamber 201 to the transfer space 203 or vice versa.

The substrate mounting stand 212 is supported by a shaft 217. The shaft 217, on one end, penetrates through the process vessel 202 from its bottom and, on the other end, is connected to an elevation mechanism 218 located outside the process vessel 202. By operating the elevation mechanism 218 to raise or lower the shaft 217 and the substrate mounting stand 212, the wafer 200 held on the substrate mounting surface 211 may be raised or lowered. In addition, the periphery of a lower end of the shaft 217 is covered with a bellows 219 in order to maintain an interior of the process space 201 airtight.

The substrate mounting stand 212 is lowered to the height of a substrate support table when the wafer 200 is to be transferred such that the substrate mounting surface 211 is located at a position of the substrate loading/unloading port 206 (wafer transfer position). The substrate mounting stand 212 is raised such that the wafer 200 is located at a processing position (wafer processing position) in the process space 201 when the wafer 200 is to be processed, as shown in FIG. 1.

In particular, as the substrate mounting stand 212 is lowered to the wafer transfer position, upper ends of the lift pins 207 protrude from the upper surface of the substrate mounting surface 211 to support the wafer 200 from below. In addition, as the substrate mounting stand 212 is raised to the wafer processing position, the lift pins 207 drift apart from the upper surface of the substrate mounting surface 211, and the substrate mounting surface 211 supports the wafer 200 from below. Further, since the lift pins 207 are in direct contact with the wafer 200, they are formed of, for example, quartz, alumina, etc.

(Exhaust Part)

An exhaust passage 225 via which the atmosphere in the process space 201 exits is installed along the outer periphery of the process space 201 (the upper vessel 202a). An exhaust port 221 is connected to the exhaust passage 225. An exhaust pipe 222 is connected to the exhaust port 221. A pressure adjuster 223 such as an APC (Auto Pressure Controller) configured to control the pressure inside the process space 201 to a predetermined value, and a vacuum pump 224 are serially connected to the exhaust pipe 222. An exhaust part (exhaust line) 220 is mainly configured of the exhaust passage 225, the exhaust port 221, the exhaust pipe 222, and the pressure adjuster 223. The exhaust passage 225 may surround the process chamber 201 so that exhaust gas all around the wafer 200 may be exhausted. In addition, the exhaust part may further include the vacuum pump 224.

(Gas Introduction Port)

A gas introduction port 241 for supplying various types of gases into the process space 201 is installed in a top surface (ceiling wall) of a gas rectifying part 234 installed in the upper portion of the process space 201, which will be described below.

(Gas Rectifying Part)

The gas rectifying part 234 is installed between the gas introduction port 241 and the process space 201. The gas rectifying part 234 includes a gas dispersion channel 234d through which a process gas exits. The gas rectifying part 234 is installed on a lid 231. A gas introduced from the gas introduction port 241 is supplied to the wafer 200 through the gas rectifying part 234. The gas rectifying part 234 may be configured as a side wall of a chamber lid assembly. In addition, the gas introduction port 241 may also act as the gas dispersion channel, so that the supplied gas is dispersed around the entire periphery of the substrate.

In addition, a lid sealing part 262 is installed in the gas rectifying part 234 as a first sealing part, maintaining the pressure inside the process chamber 201. The lid sealing part 262 is made of the same material as the process vessel sealing part 260.

(Process Gas Supply Part)

Figure 2:
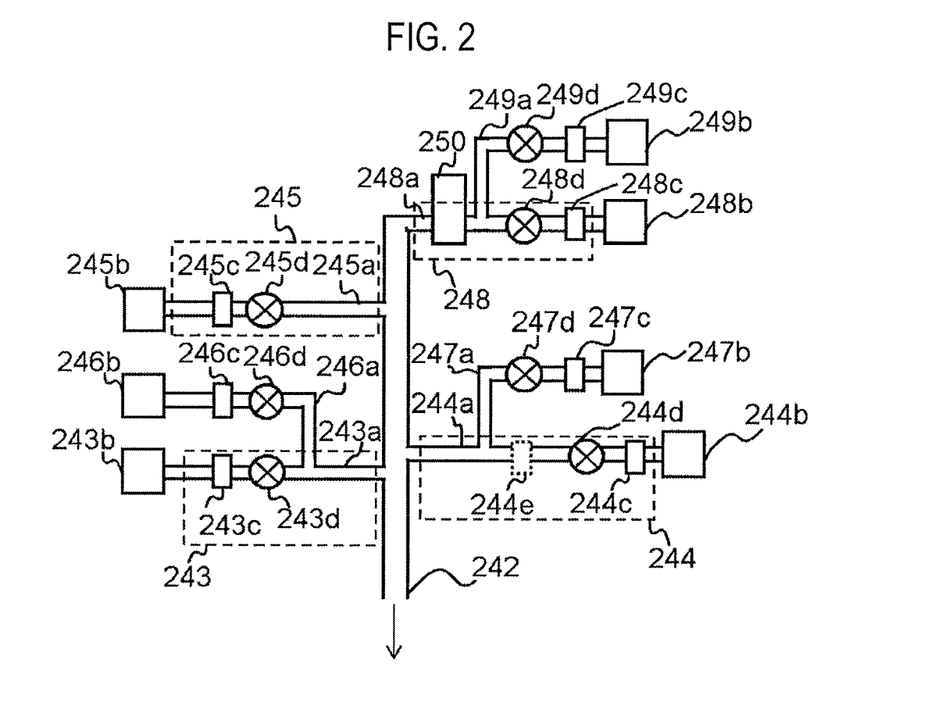
FIG. 2 is a diagram schematically illustrating the configuration of a gas supply part according to one embodiment of the present disclosure.

A common gas supply pipe 242 is connected to the gas introduction port 241, which is connected to the gas rectifying part 234. As shown in FIG. 2, a first gas supply pipe 243a, a second gas supply pipe 244a, a third gas supply pipe 245a, and a cleaning gas supply pipe 248a are connected to the common gas supply pipe 242.

A first element-containing gas (first process gas) is mainly supplied from a first gas supply part 243 including the first gas supply pipe 243a. A second element-containing gas (second process gas) is mainly supplied from a second gas supply part 244 including the second gas supply pipe 244a. A purge gas is mainly supplied from a third gas supply part 245 including the third gas supply pipe 245a. A cleaning gas is mainly supplied from a cleaning gas supply part 248 including the cleaning gas supply pipe 248a. The process gas supply part is configured with one or both of the first process gas supply part and the second process gas supply part. The process gas is composed of one or both of the first process gas and the second process gas.

(First Gas Supply Part)

A first gas supply source 243b, a mass flow controller (MFC) 243c that is a flow rate controller (flow rate control part), and a valve 243d, which is an opening/closing valve, are installed in the first gas supply pipe 243a in this order in the downstream direction.

A gas containing a first element (first process gas) is supplied to the gas rectifying part 234 from the first gas supply source 243b through the mass flow controller 243c, the valve 243d, the first gas supply pipe 243a, and the common gas supply pipe 242.

The first process gas is a precursor gas, i.e., one of the process gases.

The first element is, for example, silicon (Si). That is, the first process gas is, for example, a silicon-containing gas. The silicon-containing gas may include, for example, a dichlorosilane ($SiH_2Cl_2$: DCS) gas. In addition, the precursor of the first process gas may be solid, liquid or gas under the atmospheric pressure at room temperature.

When the precursor of the first process gas is liquid under the atmospheric pressure at room temperature, a vaporizer (not shown) needs be installed between the first gas supply source 243b and the mass flow controller 243c. Herein, it is assumed that the precursor is a gas.

A downstream end of the first inert gas supply pipe 246a is connected to the first gas supply pipe 243a further downstream than the valve 243d. An inert gas supply source 246*b*, a mass flow controller (MFC) 246*c* that is a flow rate controller (flow rate control part), and a valve 246*d*, which is an opening/closing valve, are installed in the first inert gas supply pipe 246*a* in this order in the downstream direction.

The inert gas is, for example, a nitrogen ($N_2$) gas. In addition, the inert gas may include, for example, a rare gas, such as a helium (He) gas, a neon (Ne) gas, and an argon (Ar) gas, in addition to the $N_2$ gas.

The first element-containing gas supply part 243 (also referred to as a silicon-containing gas supply part) is mainly configured with the first gas supply pipe 243*a*, the mass flow controller 243*c*, and the valve 243*d*.

In addition, a first inert gas supply part is mainly configured with the first inert gas supply pipe 246*a*, the mass flow controller 246*c*, and the valve 246*d*. The first inert gas supply part may include the inert gas supply source 246*b* and the first gas supply pipe 243*a*.

Further, the first element-containing gas supply part may include the first gas supply source 243*b* and the first inert gas supply part.

(Second Gas Supply Part)

A second gas supply source 244*b*, a mass flow controller (MFC) 244*c* that is a flow rate controller (flow rate control part), and a valve 244*d*, which is an opening/closing valve, are installed in the second gas supply pipe 244*a* in this order in the downstream direction.

A gas containing a second element (hereinafter, referred to as "second process gas") is supplied to the gas rectifying part 234 from the second gas supply source 244*b* though the mass flow controller 244*c*, the valve 244*d*, the second gas supply pipe 244*a*, and the common gas supply pipe 242.

The second process gas is one of the process gases. In addition, the second process gas may be considered as a reaction gas or a modifying gas.

The second process gas contains a second element different from the first element. The second element includes, for example, at least one of oxygen (O), nitrogen (N), carbon (C), and hydrogen (H). In one embodiment, the second process gas is, for example, a nitrogen-containing gas. Specifically, an ammonia ($NH_3$) gas may be used as the nitrogen-containing gas.

The second process gas supply part 244 is mainly configured with the second gas supply pipe 244*a*, the mass flow controller 243*c*, and the valve 243*d*.

Additionally, a remote plasma unit (RPU) 244*e* may be installed as an activation part to activate the second process gas.

In addition, a downstream end of the second inert gas supply pipe 247*a* is connected to the second gas supply pipe 244*a* further downstream than the valve 244*d*. An inert gas supply source 247*b*, a mass flow controller (MFC) 247*c* that is a flow rate controller (flow rate control part), and a valve 247*d*, which is an opening/closing valve, are installed in the second inert gas supply pipe 247*a* in this order in the downstream direction.

An inert gas is supplied from the second inert gas supply pipe 247*a* to the gas rectifying part 234 through the mass flow controller 247*c*, the valve 247*d*, and the second gas supply pipe 244*a*. The inert gas works as a carrier gas or a dilution gas in a film forming process (S203 to S207 to be described below).

The second inert gas supply part is mainly configured with the second inert gas supply pipe 247*a*, the mass flow controller 247*c*, and the valve 247*d*. The second inert gas supply part may include the inert gas supply source 247*b* and the second gas supply pipe 244*a*.

Further, the second element-containing gas supply part may include the second gas supply source 244*b* and the second inert gas supply part.

(Third Gas Supply Part)

A third gas supply source 245*b*, a mass flow controller (MFC) 245*c*, which is a flow rate controller (flow rate control part), and a valve 245*d*, which is an opening/closing valve, are installed in the third gas supply pipe 245*a* in this order in the downstream direction.

An inert gas as a purge gas is supplied to the gas rectifying part 234 from the third gas supply source 245*b* though the mass flow controller 245*c*, the valve 245*d*, the third gas supply pipe 245*a*, and the common gas supply pipe 242.

The inert gas is, for example, a nitrogen ($N_2$) gas. In addition, the inert gas may include, for example, a rare gas, such as a helium (He) gas, a neon (Ne) gas, and an argon (Ar) gas, in addition to the $N_2$ gas.

The third gas supply part 245 (also referred to as a purge gas supply part) is mainly configured with the third gas supply pipe 245*a*, the mass flow controller 245*c*, and the valve 245*d*.

(Cleaning Gas Supply Part)

A cleaning gas source 248*b*, a mass flow controller (MFC) 248*c*, a valve 248*d*, and a remote plasma unit (RPU) 250 are installed in a cleaning gas supply pipe 248*a* in this order in the downstream direction.

A cleaning gas is supplied to the gas rectifying part 234 from the cleaning gas source 248*b* though the MFC 248*c*, the valve 248*d*, the RPU 250, the cleaning gas supply pipe 248*a*, and the common gas supply pipe 242.

A downstream end of the fourth inert gas supply pipe 249*a* is connected to the cleaning gas supply pipe 248*a* further downstream than the valve 248*d*. A fourth inert gas supply source 249*b*, an MFC 249*c*, and a valve 249*d* are installed in a fourth inert gas supply pipe 249*a* in this order in the downstream direction.

The cleaning gas supply part is mainly configured with the cleaning gas supply pipe 248*a*, the MFC 248*c*, and the valve 248*d*. The cleaning gas supply part may include the cleaning gas source 248*b*, the fourth inert gas supply pipe 249*a*, and the RPU 250.

Further, the inert gas supplied from the fourth inert gas supply source 249*b* may act as a carrier gas or a dilution gas for the cleaning gas.

The cleaning gas supplied from the cleaning gas source 248*b* may remove byproducts adsorbed onto the gas rectifying part 234 or the process chamber 201 during the cleaning process.

The cleaning gas is, for example, a nitrogen trifluoride ($NF_3$) gas. In addition, the cleaning gas may include, for example, a hydrogen fluoride (HF) gas, a chlorine trifluoride ($ClF_3$) gas, a fluorine ($F_2$) gas, etc., or a combination thereof.

In some embodiments, a device having high responsibility to gas flow such as a needle valve or an orifice may be used as the flow rate control parts installed in the gas supply parts. For example, if the pulse width of the gas is in the order of milliseconds, the MFC may not respond thereto. However, by combining a high speed ON/OFF valve with a needle valve or an orifice, it is possible to respond to a gas pulse having a pulse width shorter than milliseconds.

(Control Part)

As shown in FIG. 1, the substrate processing apparatus 100 includes a controller 121 configured to control the operations of the individual parts of the substrate processing apparatus 100.

Figure 5:
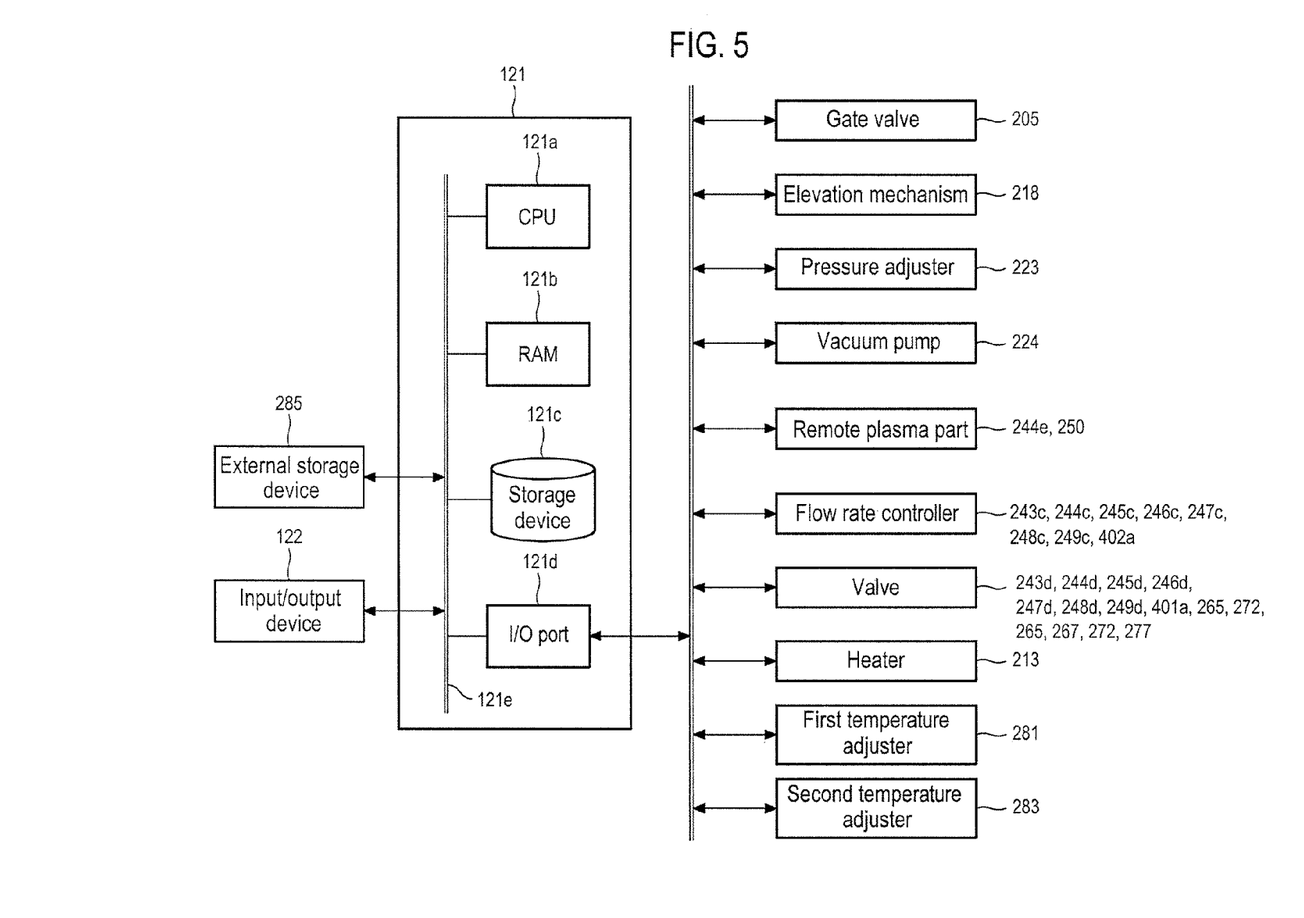
FIG. 5 is a diagram schematically illustrating the configuration of a controller of a substrate processing apparatus according to one embodiment of the present disclosure.

As illustrated in FIG. 5, the controller 121, which is a control part (control means), is configured as a computer including a CPU (Central Processing Unit) 121a, a RAM (Random Access Memory) 121b, a memory device 121c, and an I/O port 121d. The RAM 121b, the memory device 121c, and the I/O port 121d are configured to exchange data with the CPU 121a via an internal bus 121e. An input/output device 122 including, for example, a touch panel or the like, or an external memory device 285 is connected to the controller 121.

The memory device 121c is configured with, for example, a flash memory, an HDD (Hard Disc Drive), or the like. A control program for controlling operations of the substrate processing apparatus or a process recipe, in which a sequence or condition for processing a substrate, which will be described later, is readably stored in the memory device 121c. Also, the process recipe functions as a program for the controller 121 to execute each sequence in the substrate processing process, which will be described later, to obtain a desired result. Hereinafter, the process recipe or control program may be collectively referred to as a program. Also, as used herein, the term program may refer to either or both of a process recipe and a control program. In addition, the RAM 121b is configured as a memory area (work area) in which a program or data read by the CPU 121a is temporarily stored.

The I/O port 121d is connected to the gate valve 205, the elevation mechanism 218, the pressure adjuster 223, the vacuum pump 224, the remote plasma parts 244e and 250, the MFCs 243c, 244c, 245c, 246c, 247c, 248c, 249c, and 402a, the valves 243d, 244d, 245d, 246d, 247d, 248d, 249d, and 401a, the heater 213, etc.

The CPU 121a is configured to read and execute the control program from the memory device 121c, and read the process recipe from the memory device 121c in response to an operation command input from the input/output device 122. The CPU 121a is configured to control the opening/closing of the gate valve 205, the operation of the elevation mechanism 218, the operation of the pressure adjuster 223, on/off control of the vacuum pump 224, gas excitation operation of the remote plasma part 250, the flow rate adjusting operation of the MFCs 243c, 244c, 245c, 246c, 247c, 248c, 249c, and 402a, gas on/off control of the valve 243d, 244d, 245d, 246d, 247d, 248d, 249d, and 401a, temperature control of the heater 213, etc., such that they operate as instructed by the read process recipe.

Moreover, the controller 121 is not limited as being configured as a dedicated computer but may be configured as a general-purpose computer. For example, the controller 121 according to one embodiment may be configured by preparing an external memory device 123 (for example, a magnetic tape, a magnetic disc such as a flexible disc or a hard disc, an optical disc such as a CD or DVD, a magneto-optical disc such as an MO, a semiconductor memory such as a USB memory or a memory card), in which the program described above is stored, and installing the program on the general-purpose computer using the external memory device 285. Also, a program may be installed in a computer in many ways besides the external memory device 285. For example, a program may be downloaded via a communication medium such as the Internet or a dedicated line, instead of the external memory device 285. The memory device 121c or the external memory device 285 is configured as a non-transitory computer-readable recording medium. Hereinafter, such a medium will be simply referred to as "a recording medium."

As used herein, the term recording medium may refer to either or both of the memory device 121c and the external memory device 285.

In the state-of-the-art, the inventors of the application have observed one or more of the following issues that occurs when the processing temperature becomes high in a processing apparatus that processes a wafer 200 by supplying a process gas to the wafer 200. The high temperature is, for example, 400 degrees Celsius or higher.

<Issue 1>

For example, when the processing temperature becomes high, it is necessary to cool down the process vessel sealing parts 260 and 262 in the process chamber 201. The material properties of the process vessel sealing parts 260 and 262 may change as the processing temperature becomes high. In addition, the material properties of the process vessel sealing parts 260 and 262 may change as they react with gases existing inside and outside the process chamber 201. For example, the sealing property may deteriorate as the sealing parts 260 and 262 react with oxygen in the atmosphere.

It is necessary to suppress such changes in the properties of the sealing parts. In order to suppress changes in properties of the sealing parts, for example, a cooling channel 263 may be installed to cool down the sealing parts. However, when the sealing parts 260 and 262 are cooled down, the surface of the gas rectifying part 234 may be cooled down. Specifically, the upstream side of the gas rectifying part 234 is cooled down, and thus, there may be a difference between the temperature at an upstream side surface 234a and the temperature at a downstream side surface 234b of the gas rectifying part 234. Due to the surface temperature of the gas rectifying part 234, the viscosity of the gas flowing near the surface is changed. As the viscosity of the gas changes, the flowability of the gas is changed, and thus, a difference in the concentration or density of the gas is made near the gas rectifying part 234 or on a surface of a wafer 200. Due to the difference in the concentration of the gas, the processing may not be performed uniformly. The difference in concentration of the gas may exist, for example, between the center and the edge of a wafer 200. In this regard, the upstream side surface 234a refers to a surface of the gas rectifying part 234 which is parallel to the gas flow moving down toward a wafer 200. The downstream side surface 234b refers to a surface of the gas rectifying part 234 which is parallel to the gas flow moving in the radial direction of the wafer 200. The gas may move in the radial direction of a wafer 200 or may move spirally from the upstream side surface 234a toward the downstream side surface 234b. When the gas moves spirally, the passage (path) of the gas becomes longer than the actual distance. Accordingly, the gas is more affected by the temperature at the surface of the gas rectifying part 234, and thus the viscosity of the gas may change more.

<Issue 2>

In addition, as the gas rectifying part 234 is cooled down, a temperature difference is generated among the gas rectifying part 234, a wafer 200, and the substrate mounting stand 212. Such a temperature difference causes thermal movement from the wafer 200 or the substrate mounting stand 212 to the gas rectifying part 234, which causes the wafer 200 or the substrate mounting stand 212 to be cooled down. In addition, since the gas rectifying part 234 has a temperature difference between the upstream side surface 234a and the downstream side surface 234b as described above, temperature distribution is also generated on the wafer 200 or the substrate mounting stand 212. The temperature distribution on the wafer 200 or the substrate mounting stand 212 may exist, for example, between the center portion and the edge portion thereof. Due to such temperature distribution, the surface of the wafer 200 may not be processed uniformly.

<Issue 3>

In addition, if the gas rectifying part 234 is overly cooled down, the gas is adsorbed onto the surfaces of the gas rectifying part 234. In particular, if the upstream side surface 234a closer to the cooling channel is overly cooled down, the gas may be adsorbed onto the upstream side surface 234a. For example, in a substrate processing apparatus in which a wafer 200 is processed by alternately supplying a process gas and a reaction gas, the reaction gas may be adsorbed onto the upstream side surface 234a. If a process gas is supplied while a reaction gas is adsorbed onto the upstream side surface 234a, the process gas reacts with the reaction gas, which may result in an unexpected reaction near the upstream side surface 234a. For example, a film may be formed on the upstream side surface 234a. In addition, a byproduct may be created and supplied to a wafer 200, which may result in an unwanted film being forming on the wafer 200. In addition, the processing of the wafer 200 may be disturbed by particles or the byproduct created when a film formed on the upstream side surface 234a is peeled off.

<Issue 4>

If the process vessel 202 has a planar shape, the upstream side surface 234a, the process space 201, the substrate mounting stand 212, and the lid sealing part 262 are disposed close to one another. In this configuration, as the elements affect each other with heat generated therefrom, it is difficult to maintain the temperatures of the elements at predetermined temperatures. In this regard, the planar configuration refers to a shape with a distance between the substrate mounting stand 212 and the lid sealing part 262 shorter than the diameter of the substrate mounting stand 212.

Figure 3:
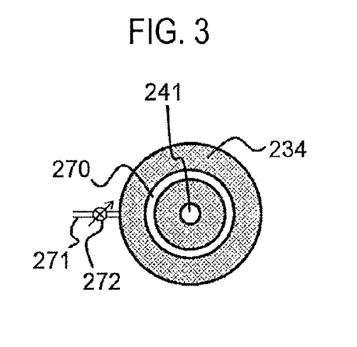
FIG. 3 is a cross-sectional view of a gas introduction hole of a gas rectifying part according to one embodiment of the present disclosure.

The inventors have found through research that one or more of the above-described Issues may be overcome with one of the following configurations A) to I), and, it is possible to improve the effects by combing the configurations:

A) Installing a first heat insulating part 270 between the lid sealing part 262 and a surface of the gas rectifying part 234 which comes in contact with the process chamber 201. As shown in FIGS. 1 and 3, the first heat insulating part 270 is configured as a groove shape at the upstream side of the gas rectifying part 234. The depth of the groove is determined such that the first heat insulating part 270 surrounds at least the upstream side surface 234a of the gas dispersion channel 234d. In addition, the first heat insulating part 270 also works as a mechanism for adjusting the amount of heat transfer (thermal conduction) in order to suppress heat dissipating from the elements such as the upstream side surface 234a, the process space 201, the substrate mounting stand 212 and the lid sealing part 262 from affecting one another.

In addition, a member having a lower thermal conductivity may be inserted into the first heat insulating part 270. For example, the member may include quartz, ceramics, aero gel, etc.

B) Connecting a first pressure adjusting part (second exhaust part) to the first heat insulating part 270 as a pressure adjusting part to evacuate the first heat insulating part 270. In this configuration, a sealing part 273 is installed in the first heat insulating part 270, so that the pressure inside the first heat insulating part 270 may be maintained. The first pressure adjusting part is configured with an exhaust pipe 271 and a valve 272. The exhaust pipe 271 is connected to an exhaust pump (not shown). In some embodiments, the opening degree of the valve 272 is adjustable. By controlling the opening degree of the valve 272, it is possible to adjust the pressure inside the first heat insulating part 270 and in turn the thermal conductivity of the first heat insulating part 270.

C) Connecting a cooling part to the cooling channel 263 for cooling down the seal part to control the amount of a refrigerant supplied to the cooling channel 263. The cooling part is configured with a supply pipe 264 and a valve 265. By controlling the amount of the supplied refrigerant, it is possible to suppress the lid sealing part 262 from being overly cooled down.

D) Installing a first gas heating part 280 on a surface of the gas rectifying part to heat the gas rectifying part 234. By heating the gas rectifying part 234, it is possible to suppress the temperature distribution or gas adsorption on the gas rectifying part 234.

The first gas heating part 280 is installed such that it covers at least the upstream side surface 234a of the gas dispersion channel 234d. The temperature of the first gas heating part 280 is controlled by a first temperature adjuster 281 connected to the first gas heating part 280.

E) Installing a second heat insulating part 274 between the exhaust passage 225 and the process vessel sealing part 260 installed between the upper vessel 202a and the lower vessel 202b. By installing the second heat insulating part 274, it is possible to suppress heat transfer in the gas rectifying part 234 in the radial direction of a wafer 200 in order to suppress the temperature distribution of the gas rectifying part 234. In addition, it is possible to suppress changes in properties of the process vessel sealing part 260 or the buffer part 261.

Figure 4:
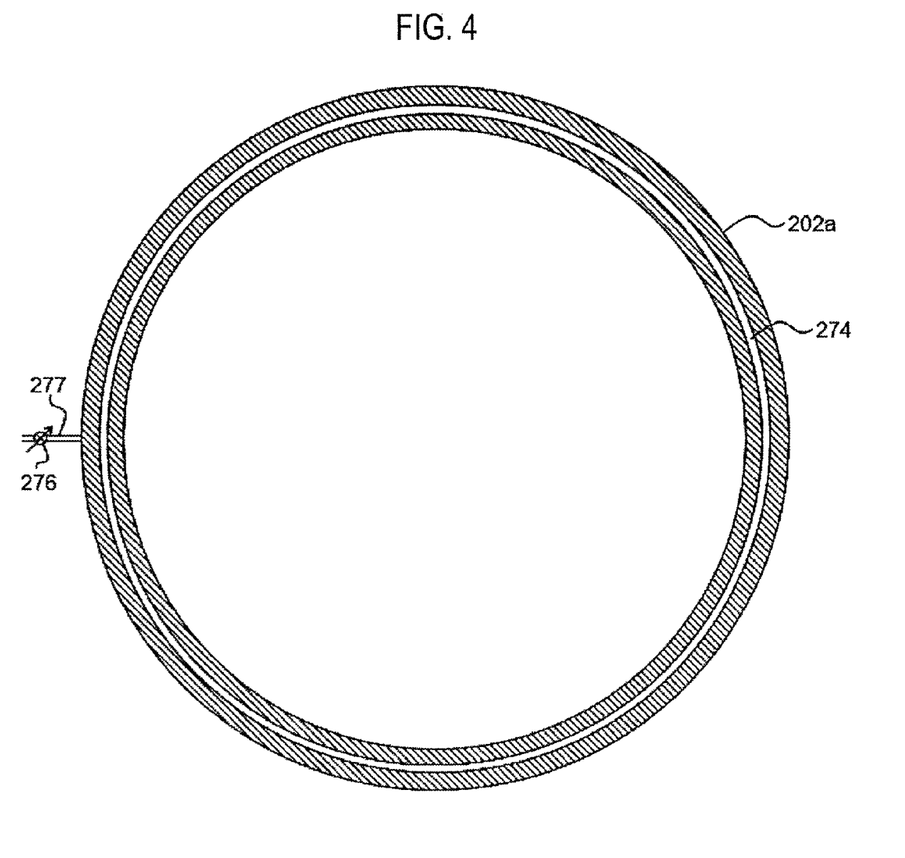
FIG. 4 is a cross-sectional view of a sealing part according to one embodiment of the present disclosure.

The second heat insulating part 274 has the same configuration as the first heat insulating part 270. For example, the second heat insulating part 274 has a groove shape as shown in FIG. 4.

F) Connecting a second pressure adjusting part (third exhaust part) to the second heat insulating part 274 as a pressure adjusting part to evacuate the second heat insulating part 274. In this configuration, a sealing part 275 is installed in the second heat insulating part 274, so that the pressure inside the second heat insulating part 274 may be maintained. The second pressure adjusting part is configured with an exhaust pipe 276 and a valve 277. In some embodiments, the opening degree of the valve 277 is adjustable. By controlling the opening degree of the valve 272, it is possible to adjust the pressure inside the second heat insulating part 274 and in turn the thermal conductivity of the second heat insulating part 274. Alternatively, the first pressure adjusting part may be connected to the second heat insulating part 274 to evacuate the second heat insulating part 274. In this manner, a simpler exhaust system may be implemented. By installing the first pressure adjusting part and the second pressure adjusting part, it is possible to separately control the pressure at the first heat insulating part 270 and the pressure at the second heat insulating part 274.

G) Installing a cooling channel 263 for cooling down the process vessel sealing part 260 to heat the process vessel sealing part 260.

It is also possible to connect the cooling part to the cooling channel 263 to adjust the amount of a refrigerant supplied to the cooling channel 263. The cooling part connected to the cooling channel 263 is configured with a supply pipe 268 and a valve 267.

H) Installing a second gas heating part 282 on a surface of the upper vessel 202a where the process vessel sealing part 260 is installed, which is also a wall of the exhaust passage 225. The temperature of the second gas heating part 282 is controlled by a second temperature adjuster 283 connected to the second gas heating part 282.

I) By using one of the configurations of B, C, D, F, G, and H or a combination thereof, the temperature of either or both of the first sealing part and the second sealing part is maintained so that the properties of the sealing parts do not deteriorate, and the temperature of the upstream side surface 234a is maintained so that no gas is adsorbed onto it.

The elements of the above-described configurations are connected to the I/O port 121d of the controller 121. The controller 121 may control the elements individually.

(2) Substrate Processing Method

As an example of a substrate processing method, a method of forming a silicon nitride ($Si_xN_y$) film using a DCS gas and $NH_3$ (ammonia) gas, which is an exemplary semiconductor device manufacturing process, will be described.

Figure 6:
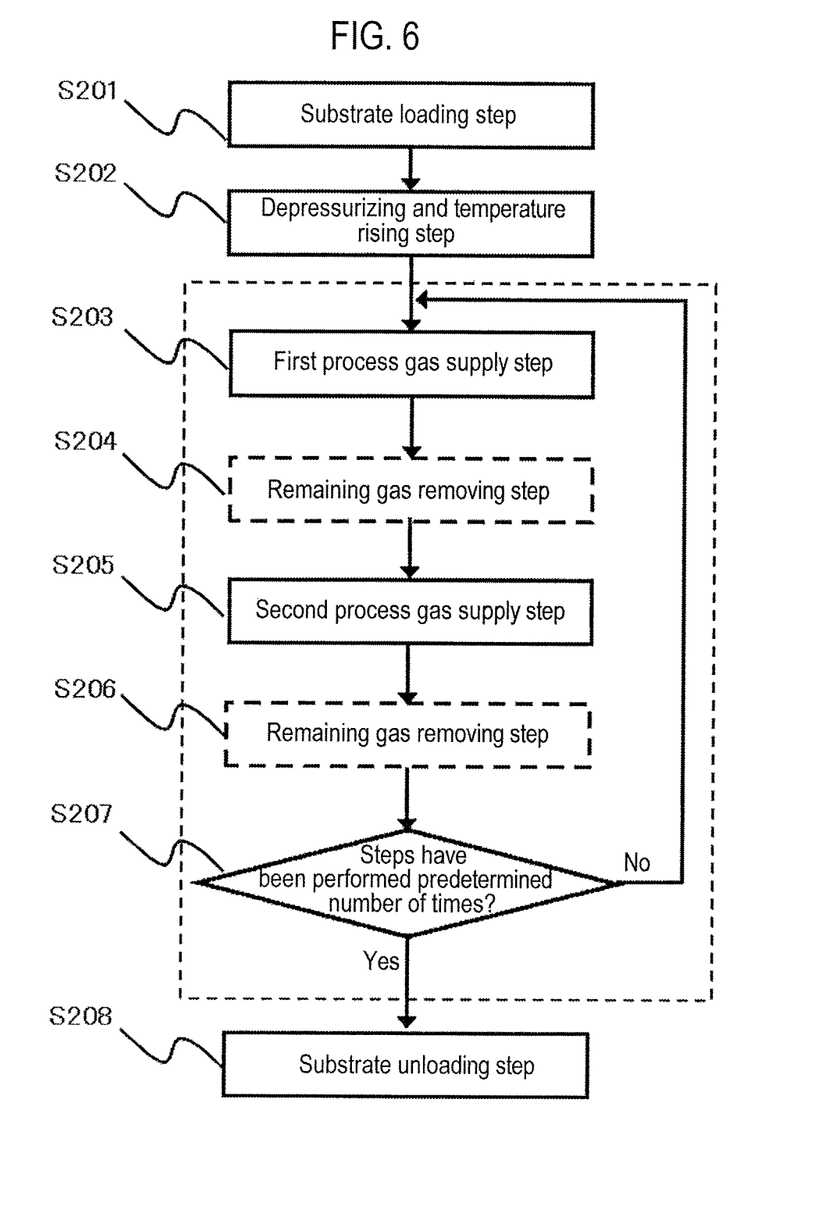
FIG. 6 is a flowchart illustrating a substrate processing method according to one embodiment of the present disclosure.

FIG. 6 is a flowchart illustrating a substrate processing method for forming a silicon nitride film ($Si_xN_y$) on a wafer 200 as a substrate, according to one embodiment of the present disclosure.

(Substrate Loading Step S201)

The film forming process starts with loading a wafer 200 into the process chamber 201. In particular, the substrate support part 210 is lowered by the elevation mechanism 218 and the lift pins 207 are inserted into the through holes 214 to protrude from the upper surface of the substrate support part 210. In addition, after the pressure of the interior of the process chamber 201 is adjusted to a predetermined value, the gate valve 205 is opened and the wafer 200 is transferred from the gate valve 205 to be held on the lift pins 207. After the wafer 200 is held on the lift pins 207, the substrate support part 210 is raised to a predetermined position by the elevation mechanism 218, so that the wafer 200 is transferred from the lift pins 207 to be held on the substrate support part 210.

While the substrate support part 210 is raised to the predetermined position, an inert gas may be supplied from the third gas supply part 245. In addition, the substrate support part 210 may be raised to a position where the protruding portion 212b of the substrate mounting stand 212 and the partition plate 204 come into contact with each other.

The substrate mounting stand 212 may be pre-heated by the heater 213. By pre-heating the substrate mounting stand 212, the time for heating a wafer 200 may be shortened. In addition, a wafer 200 may be pre-heated if the wafer 200 bounces up or has a warpage when it is transferred from the lift pins 207 to be held on the mounting surface 211. The wafer 200 may be pre-heated either inside or outside the substrate processing apparatus 100. For example, if a wafer 200 is pre-heated inside the substrate processing apparatus 100, the wafer 200 is supported by the lift pins 207 and is heated for a predetermined time period, with a predetermined first distance between the substrate mounting stand 212 and the substrate.

Herein, the first distance may correspond to the distance from the substrate mounting stand 212 to the transfer position, at which the wafer 200 is transferred from the gate valve 205. In addition, the first distance may be shorter than the distance from the substrate mounting stand 212 to the transfer position. The temperature rising time period when the wafer 200 is pre-heated inside the substrate processing apparatus 100 may vary depending on the distance between the wafer 200 and the substrate mounting stand 212. The shorter the distance is, the shorter the temperature rising time period is. Specifically, the substrate mounting stand is pre-heated, and the wafer 200 or a susceptor is mounted thereon for a while after there is no temperature difference.

The temperature of the heater 213 is set to a constant temperature, similar to the time when supplying the precursor gas to the wafer 200, from 300 to 850 degrees Celsius, or from 300 to 800 degrees Celsius, or from 300 to 750 degrees Celsius. Heating the wafer 200 or the substrate mounting stand 212 by the heater 213 continues, for example, until it is determined in step S207 that the steps have been performed a predetermined number of times.

In addition, the first heat insulating part 270 may be evacuated before the wafer 200 is loaded into the process chamber 201, and continued until the pressure inside the first heat insulating part 270 is adjusted to a predetermined pressure. In this case, the predetermined pressure is determined as a pressure (first pressure) at which the amount of heat transferred from the upstream side surface 234a to the lid sealing part 262 and the amount of heat transferred from the heated substrate mounting stand 212 to the upstream side surface 234a are balanced so that the temperature at the upstream side surface 234a becomes a predetermined temperature.

Figure 7:
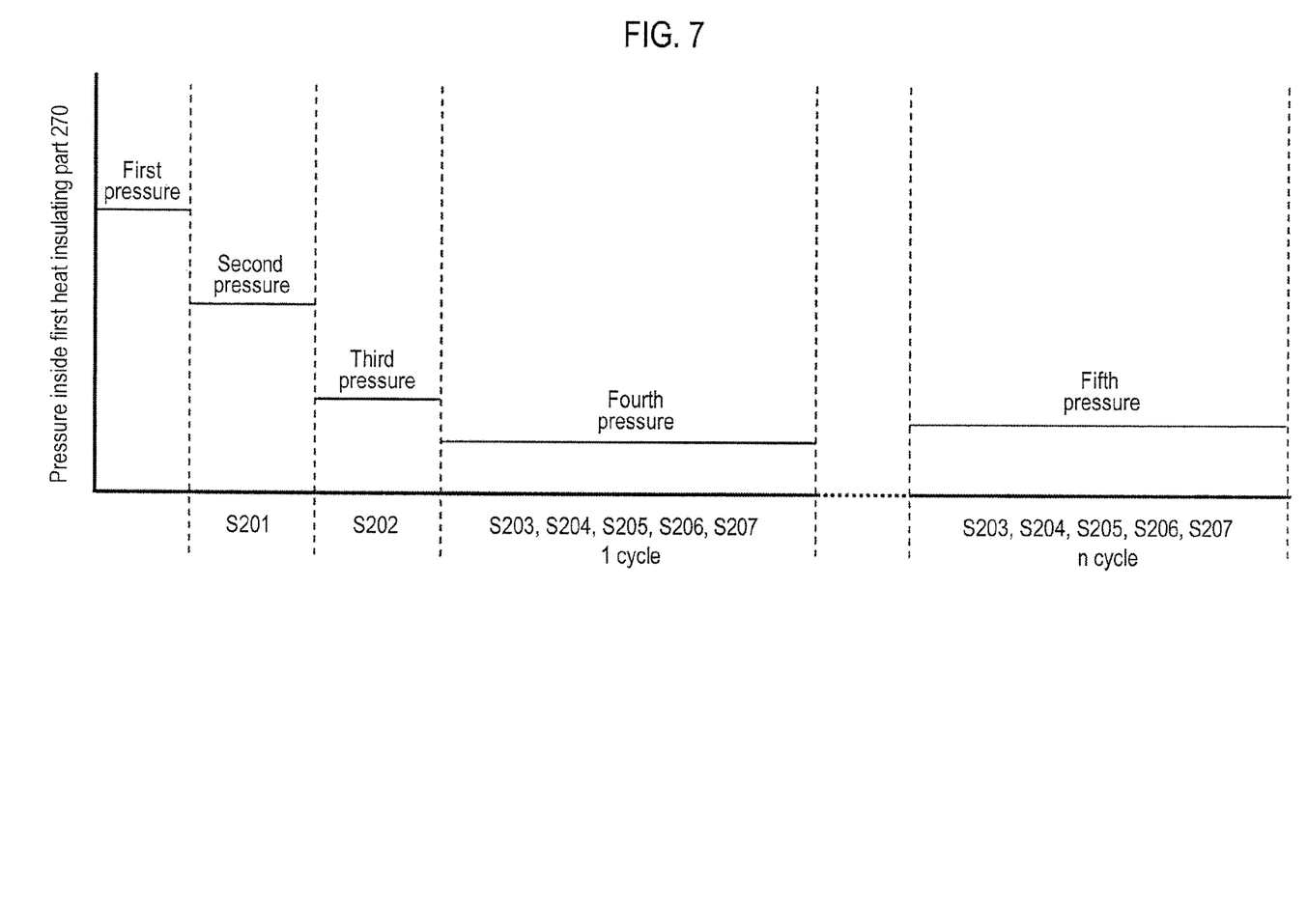
FIG. 7 is a sequence diagram for controlling a pressure inside a first heat insulating part according to one embodiment of the present disclosure.

When the wafer 200 is held on the substrate mounting stand 212 as shown in FIG. 7, the pressure inside the first heat insulating part 270 may be a second pressure that is lower than the first pressure. The heat transferred from the substrate mounting stand 212 to the upstream side surface 234a is temporarily blocked by the wafer 200. If the pressure inside the first heat insulating part 270 is maintained at the first pressure at this time, the temperature at the upstream side surface 234a may be lowered to be less than the predetermined temperature. Accordingly, by changing the pressure inside the first heat insulating part to the second pressure, the amount of heat transferred from the upstream side surface 234a to the lid sealing part 262 is reduced, thereby suppressing the temperature of the upstream side surface 234a from deviating from the predetermined temperature.

The pressure inside the second heat insulating part 274 is in a vacuum state during at least the processes of S203, S204, S205, S206, and S207, and possibly during the process of S201. If the second heat insulating part 274 is in a vacuum state from S201, the heat transfer from the substrate mounting stand 212 to the exhaust passage 225 is suppressed, so that the temperature adjusting time of the substrate mounting stand 212 may be shortened.

(Depressurizing and Temperature Rising Step S202)

Subsequently, the process chamber 201 is evacuated through the exhaust pipe 222 such that the pressure inside the process chamber 201 is set to a desired pressure (vacuum level). In doing so, the opening degree of the APC valve as the pressure adjuster 223 is controlled based on a feedback signal indicating a pressure value measured by a pressure sensor. In addition, an amount of power supplied to the heater 213 is controlled based on a feedback signal indicating a temperature value detected by a temperature sensor (not shown) so that the temperature inside the process chamber 201 is set to a desired temperature. While waiting for the temperature of the wafer 200 to be uniform, a process of removing moisture remaining in the process chamber 201 or a gas removed from a material by evacuation or purging with a $N_2$ gas may be performed. In this manner, the preparation for the film forming process is completed. In addition, when the process chamber 201 is evacuated to a desired pressure, it is preferable in some embodiments to evacuate the process chamber 201 to the minimum pressure in a single process.

In addition, as shown in FIG. 7, the pressure inside the first heat insulating part 270 may be set to a third pressure that is lower than the second pressure. The heat transfer from the substrate mounting stand 212 or the heated wafer 200 to the upstream side surface 234a may be carried out by heat conduction via the atmosphere in the process chamber 201 or by heat radiation from the substrate mounting stand 212 or the wafer 200. When the pressure inside the process chamber 201 is depressurized, the heat conduction via the atmosphere in the process chamber 201 is reduced. Accordingly, if the pressure inside the process chamber 201 is maintained at the second pressure, the temperature at the upstream side surface 234a may be lowered to be less than a predetermined temperature. Accordingly, by changing the pressure inside the process chamber 201 to the third pressure, the temperature at the upstream side surface 234a may be maintained at the predetermined temperature.

(First Process Gas Supply Step S203)

Subsequently, as shown in FIG. 6, the DCS gas as the first process gas (precursor gas) is supplied into the process chamber 201 from the first process gas supply part. In addition, while the process chamber 201 is being evacuated by the exhaust part, the pressure inside the process chamber 201 is controlled to a predetermined pressure (first pressure). Specifically, the valve 243d of the first gas supply pipe 243a and the valve 246d of the first inert gas supply pipe 246a are opened to allow the DCS gas to flow through the first gas supply pipe 243a and the $N_2$ gas to flow through the first inert gas supply pipe 246a. The DCS gas flows from the first gas supply pipe 243a, and a flow rate of the DCS gas is adjusted by the MFC 243c to a predetermined value. The $N_2$ gas flows from the first inert gas supply pipe 246a, and a flow rate of the $N_2$ gas is adjusted by the MFC 246c to a predetermined value. The adjusted DCS gas and the adjusted $N_2$ gas are mixed together in the first gas supply pipe 243a to be supplied into the process chamber 201 from the gas rectifying part 234, and then exit via the exhaust pipe 222. At this time, the DCS gas is supplied to the wafer 200 [precursor gas (DCS) supply step]. The DCS gas is supplied into the process chamber 201 at a pressure in a predetermined pressure range (first pressure, for example, ranging from 100 to 10,000 Pa). In this manner, the DCS gas is supplied to the wafer 200. As the DCS gas is supplied, a silicon-containing layer is formed on the wafer 200. The silicon-containing layer refers to a layer containing silicon (Si), or silicon and chlorine (Cl).

(Remaining Gas Removing Step S204)

After the silicon-containing layer is formed on the wafer 200, the valve 243d of the first gas supply pipe 243a is closed to stop supplying the DCS gas. At this time, with the APC valve 223 of the exhaust pipe 222 open, the process chamber 201 is evacuated by the vacuum pump 224. The DCS gas remaining in the process chamber 201, which did not participate in the reaction or has already contributed to the formation of the silicon-containing layer, is removed from the process chamber 201. In addition, with the valve 246d open, the $N_2$ gas as the inert gas may be continuously supplied into the process chamber 201. The $N_2$ gas, which is continuously supplied from the valve 246d, acts as a purge gas. Thus, the DCS gas remaining in the first gas supply pipe 243a, the common gas supply pipe 242, and the process chamber 201, which did not participate in the reaction or has already contributed to the formation of the silicon-containing layer, may be removed more effectively.

Moreover, in doing so, the gas remaining in the process chamber 201 or the gas rectifying part 234 does not need to be completely removed (the process chamber 201 does not need to be completely purged). As long as the gas remaining in the process chamber 201 is trivial in quantity, it does not adversely affect subsequent steps performed thereafter. In this case, the flow rate of the $N_2$ gas supplied into the process chamber 201 does not need to be high. For example, the volume of the $N_2$ gas equal to the volume of the process chamber 201 will be enough to perform purging without adversely affecting subsequent processes. As such, as the process chamber 201 is not completely purged, the purge time may be shortened, thereby improving the throughput. In addition, the consumption of the $N_2$ gas may also be reduced to the minimum.

The temperature of the heater 213 at this time is set similarly to that when the precursor gas is supplied to the wafer 200. The flow rate of supplying the $N_2$ gas as the purge gas from the inert gas supply parts ranges from, for example, 100 to 20,000 sccm. The purge gas may include a rare gas such as an Ar gas, a He gas, a Ne gas, a Xe gas, etc., in addition to the $N_2$ gas.

(Second Process Gas Supply Step S205)

After the DCS gas remaining in the process chamber 201 is removed, supplying the purge gas stops, and the $NH_3$ gas as a reaction gas is supplied into the process chamber 201. Specifically, the valve 244d of the second gas supply pipe 244a is opened to allow the $NH_3$ gas to flow in the second gas supply pipe 244a. The flow rate of the $NH_3$ gas flowing in the second gas supply pipe 244a is adjusted by the MFC 244c. The adjusted $NH_3$ gas is supplied to the wafer 200 through the common gas supply pipe 242 and the gas rectifying part 234. The $NH_3$ gas supplied to the wafer 200 reacts with the silicon-containing layer formed on the wafer 200 to nitride the silicon, and impurities such as hydrogen, chlorine, hydrogen chloride, etc., are discharged.

The temperature of the heater 213 at this time is set similarly to that when the precursor gas is supplied to the wafer 200.

(Remaining Gas Removing Step S206)

After the second process gas supply step, supplying the reaction gas stops, and the same process as the remaining gas removing step S204 is performed. By performing the remaining gas removing step, the $NH_3$ gas remaining in the second gas supply pipe 244a, the common gas supply pipe 242, the process chamber 201, etc., which did not participate in the reaction or has already contributed to the nitriding of the silicon may be removed. By removing the residual gas, it is possible to suppress an unexpected film from being formed by the residual gas.

(Repetition Step S207)

By performing each of the first process gas supply step S203, the remaining gas removing step S204, the second process gas supply step S205, and the remaining gas removing step S206 once, a silicon nitride ($Si_xN_y$) film having a predetermined thickness is deposited on the wafer 200. By repeating these steps, it is possible to control the thickness of the silicon nitride film on the wafer 200.

The steps are repeated a predetermined number of times until a desired film thickness is obtained.

In addition, as shown in FIG. 7, in each of the steps S203, S204, S205, and S206, the pressure inside the first heat insulating part 270 is set to a fourth pressure lower than the third pressure. During the steps of S203, S204, S205, and S206, the upstream side surface 234a may be cooled down by the supplied gases. When the upstream side surface 234a is cooled down, the viscosity of the gas flowing near the upstream side surface 234a is lowered. As the viscosity of the gas is lowered, the gas is adsorbed on the upstream side surface 234a, and a film is formed on the upstream side surface 234a thereby creating particles. In this regard, by setting the pressure inside the first heat insulating part 270 to the fourth pressure, it is possible to keep the temperature at the upstream side surface 234a from decreasing.

In addition, after a cycle consisting of steps S203, S204, S205, and S206 has been performed n times, or after a plurality of wafers 200 has been processed, a film may be deposited on the upstream side surface 234a. When this happens, the upstream side surface 234a may have a bumpy surface due to the deposited film, and is likely to absorb heat radiated from the substrate mounting stand 212 or the wafer 200. To cope with this, by setting the pressure inside the first heat insulating part 270 to a fifth pressure higher than the fourth pressure, it is possible to adjust the temperature at the upstream side surface 234a to a desired temperature.

(Substrate Unloading Step S208)

After it is determined in step S207 that the steps have been performed a predetermined number of times, a substrate unloading step S208 is performed to unload the wafer 200 from the process chamber 201. Specifically, an inert gas is supplied into the process chamber 201, and the pressure inside the process chamber 201 is adjusted to a pressure at which the wafer 200 may be transferred therefrom. After the pressure is adjusted, the substrate support part 210 is lowered by the elevation mechanism 218. The lift pins 207 protrude via the through holes 214, and the wafer 200 is held on the lift pins 207. After the wafer 200 is held on the lift pins 207, the gate valve 205 is opened, and then the wafer 200 is unloaded from the process chamber 201. Optionally, the temperature of the wafer 200 may be decreased before it is unloaded.

(3) Effects According to the Embodiment

The embodiment exhibits one or more of the following effects (a) to (h):

(a) By installing the first heat insulating part 270, thermal conduction between the cooling channel 263 and the upstream side surface 234a is suppressed, so that the temperatures at the first sealing part 262 and the surface of the upstream side surface 234a may be maintained at a desired temperature. As a result, it is possible to keep the sealing property from deteriorating. In addition, it is possible to suppress changes in the viscosity of the gas flowing near the upstream side surface 234a, and a difference between the viscosity of the gas flowing near the upstream side surface 234a and the viscosity of the gas flowing near the downstream side surface 234b may be reduced. As a result, the substrate may be processed more uniformly. Furthermore, it is possible to keep the gas from being adsorbed onto the upstream side surface 234a.

(b) Since pressure is proportional to thermal conductivity, by making the pressure (vacuum level) inside the first heat insulating part 270 adjustable, it is possible to vary the thermal conductivity of the first heat insulating part 270. For example, the thermal conductivity may be lowered by decreasing the pressure inside the first heat insulating part 270. The thermal conductivity may be raised by increasing the pressure inside the first heat insulating part 270. By adjusting the pressure inside the first heat insulating part 270 to a predetermined pressure, the amount of heat radiated from the substrate mounting stand 212 to be absorbed by the upstream side surface 234a and the amount of heat cooled by the cooling channel 263 are balanced. As a result, the temperature at the upstream side surface 234a may be maintained at a desired temperature. In addition, the temperature of the first sealing part 262 may be maintained at such a temperature that the sealing property does not deteriorate.

(c) In addition, even if the amount of heat radiated from the substrate mounting stand 212 to be absorbed or reflected is decreased when a film is deposited or dust is attached on the upstream side surface 234a, the temperature at the upstream side surface 234a is maintained at a predetermined temperature by adjusting the vacuum level inside the first heat insulating part 270. As a result, it is possible to keep the gas from being adsorbed onto the upstream side surface 234a. Furthermore, it is possible to maintain the viscosity of the gas flowing near the upstream side surface 234a at a predetermined viscosity.

(d) By installing the cooling part, the flow rate of a refrigerant supplied to the cooling channel 263 may be adjusted. As a result, it is possible to keep the temperature from decreasing at the upstream side surface 234a due to overcooling.

(e) By installing the first gas heating part 280, the upstream side surface 234a may be heated. As a result, it is possible to maintain the temperature at the upstream side surface 234a at a constant temperature or to suppress the viscosity change of the gas caused when the temperature of the gas flowing in the gas dispersion channel 234d is decreased.

(f) By installing the second heat insulating part 274, the heat transfer in the gas rectifying part 234 in the radial direction of the wafer 200 may be suppressed. As a result, it is possible to suppress temperature distribution in the gas rectifying part 234. In addition, it is possible to suppress changes in properties of the process vessel sealing part 260 or the buffer part 261. In addition, it is possible to keep byproducts from being adsorbed onto walls of the exhaust passage 225 when the walls of the exhaust passage 225 are cooled down.

(g) The vacuum level inside the second heat insulating part 274 may be adjusted. As a result, it is possible to adjust the thermal conductivity of the second heat insulating part 274.

(h) By making the flow rate of a refrigerant supplied to the cooling channel 263 adjustable, the temperature decrease at the exhaust passage 225 due to overcooling is suppressed. As a result, it is possible to suppress a film from being formed or particles from being deposited in the exhaust passage 225. In addition, the number of particles in the exhaust passage 225 may be reduced. As a result, it is possible to keep the particles from being introduced into the process chamber 201 from the exhaust passage 225.

Other Embodiments

Hereinabove, the first embodiment has been described in detail, but the present disclosure is not limited to the above-described embodiment and may be variously modified without departing from the spirit of the present disclosure.

For example, the gas rectifying part 234 may be made of a transparent material and the first gas heating part 280 may be configured as a lamp heater, and the viscosity of the gas flowing near the upstream side surface 234a may be adjusted by turning on the lamp heater at the time of supplying either or both of the first gas and the second gas. Furthermore, it is possible to keep the gas from being adsorbed onto the upstream side surface 234a by adjusting the temperature.

Figure 8:
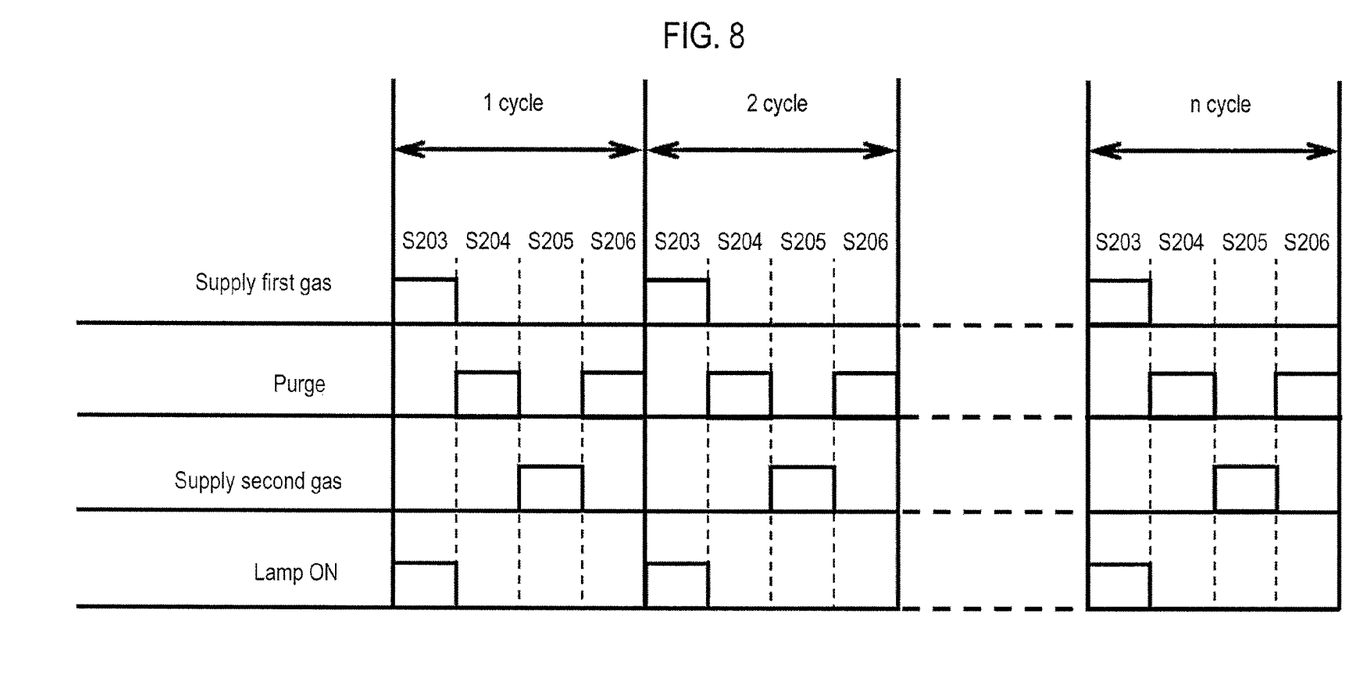
FIG. 8 is a timing diagram showing a sequence of supplying gases and turning on/off a lamp in a substrate processing method according to one embodiment of the present disclosure.

For example, FIG. 8 shows a sequence of supplying a first gas and turning on/off a lamp when the upstream side surface 234a is heated.

Further, although the method for forming a film by alternately supplying the first gas (precursor gas) and the second gas (reaction gas) has been described above, the present disclosure may also be applied to other methods. For example, the precursor gas and the reaction gas may be supplied at the same time.

Furthermore, the precursor gas and the reaction gas may be supplied to be used in a CVD film-forming method.

In addition, although the present disclosure has been described with respect to the film-forming process, it may be applied to other processes. For example, by using either or both of the precursor gas and the reaction gas, the present disclosure may be applied to a diffusion process, an oxidation process, a nitriding process, an oxygen-nitriding process, a reduction process, an oxidation-reduction process, an etching process, a heating process, etc. For example, by using the reaction gas only, the present disclosure may be applied to performing a plasma oxidation process or a plasma nitriding process on a surface of a substrate or a film formed on a substrate. In addition, by using the reaction gas only, the present disclosure may be applied to a plasma annealing process.

In addition, although the present disclosure has been described above with respect to the process of manufacturing a semiconductor device, the embodiments of the present disclosure may be applied to other processes other than the process of manufacturing a semiconductor device. For example, the present disclosure may be applied to a process of manufacturing a liquid-crystal device, or a process of producing a ceramic substrate.

Although the example of forming a silicon nitride film has been described above, the present disclosure may also be applied to methods for forming films using other gasses. For example, the present disclosure may be applied in forming an oxygen-containing film, a nitride-containing film, a carbon-containing film, a boron-containing film, a metal-containing film, and a film containing two or more elements. In addition, the produced films may include, for example, a SiO film, a TiN film, a AlO film, ZrO film, a HfO film, a HfAlO film, a ZrAlO film, a SiC film, a SiCN film, a SiBN film, a TiAlN film, a TiC film, a TiAlC film, etc. A film may be produced by substituting any of the metal elements with another transition metal or another metal element.

Aspects of the Present Disclosure

Hereinafter, aspects of the present disclosure will be additionally stated.
<Supplementary Note 1>
According to an aspect of the present disclosure, there is provided a substrate processing apparatus, including: a process chamber configured to process a substrate; a substrate mounting stand installed in the process chamber and configured to mount the substrate; a heating part configured to heat the substrate; a gas rectifying part configured to supply a process gas to the substrate; a sealing part installed in the gas rectifying part; a heat insulating part installed between the sealing part and an upstream side surface of the gas rectifying part; and a first pressure adjusting part connected to the heat insulating part.
<Supplementary Note 2>
The substrate processing apparatus according to Supplementary Note 1, may further include: a control part configured to control the first pressure adjusting part to maintain a pressure inside the heat insulating part at a first predetermined pressure.
<Supplementary Note 3>
The substrate processing apparatus according to Supplementary Note 2, may further include: a cooling channel configured to cool down the sealing part; and a cooling part configured to supply a refrigerant to the cooling channel. The control part is configured to control the first pressure adjusting part and the cooling part to maintain a temperature of the upstream side surface at a predetermined temperature.
<Supplementary Note 4>
In the substrate processing apparatus according to any one of Supplementary Notes 1 to 3, the gas rectifying part is configured to have a diameter widening toward an outer periphery of the substrate, the gas rectifying part includes a gas channel via which the gas passes, and the upstream side surface is installed at an upstream side of the gas channel.
<Supplementary Note 5>
In the substrate processing apparatus according to Supplementary Note 4, the heat insulating part is installed to surround the upstream side of the gas channel.
<Supplementary Note 6>
The substrate processing apparatus according to Supplementary Note 1, may further include an exhaust part installed at an outer periphery of the gas rectifying part. The exhaust part is configured to exhaust an atmosphere in the process chamber; and the exhaust part includes a second heat insulating part at an outer periphery thereof.
<Supplementary Note 7>
The substrate processing apparatus according to Supplementary Note 6, may further include a second pressure adjusting part connected to the second heat insulating part. The control part is configured to control the second pressure adjusting part to maintain a pressure inside the second heat insulating part at a second predetermined pressure.
<Supplementary Note 8>
The substrate processing apparatus according to Supplementary Note 6, may further include a second heating part installed between the second heat insulating part and the exhaust part. The control part is configured to control the second heating part and the second pressure adjusting part to maintain a temperature of the second heat insulating part at a predetermined temperature.
<Supplementary Note 9>
The substrate processing apparatus according to Supplementary Notes 1 to 8, may further include: a gas supply part configured to supply a gas to the gas rectifying part. The control part is configured to control the gas supply part to sequentially supply the process gas and a reaction gas.
<Supplementary Note 10>
According to another aspect of the present disclosure, there is provided a gas rectifying part for supplying a gas to a substrate held on a substrate mounting stand, the gas rectifying part including: a heating part configured to heat the substrate; a sealing part installed in the gas rectifying part; a heat insulating part installed between the sealing part and an upstream side surface of the gas rectifying part; and a first pressure adjusting part connected to the heat insulating part.
<Supplementary Note 11>
The gas rectifying part according to Supplementary Note 10, may further include: a control part configured to control the first pressure adjusting part to maintain a pressure inside the heat insulating part at a predetermined pressure.

<Supplementary Note 12>

The gas rectifying part according to Supplementary Note 11, may further include: a cooling channel configured to cool down the sealing part; and a cooling part configured to supply a refrigerant to the cooling channel. The control part is configured to control the first pressure adjusting part and the cooling part to maintain a temperature of the upstream side surface at a predetermined temperature.

<Supplementary Note 13>

In the gas rectifying part according to any one of Supplementary Notes 10 to 12, the gas rectifying part includes a gas channel via which the gas passes, a diameter of the gas channel gradually widening toward an outer periphery of the substrate, and the upstream side surface is installed at an upstream side of the gas channel.

<Supplementary Note 14>

In the gas rectifying part according to Supplementary Note 13, the heat insulating part is installed to surround the upstream side of the gas channel.

<Supplementary Note 15>

According to still another aspect of the present disclosure, there is provided a method of manufacturing a semiconductor device or a method of processing a substrate, including: heating a substrate held on a substrate mounting stand; supplying a gas to the substrate via a gas rectifying part; and maintaining a pressure inside a heat insulating part installed between the sealing part installed in the gas rectifying part and an upstream side surface of the gas rectifying part.

<Supplementary Note 16>

The method according to Supplementary Note 15, may further include cooling a sealing part down to the predetermined temperature.

<Supplementary Note 17>

According to still another aspect of the present disclosure, there is provided a program or a non-transitory computer-readable recording medium storing the program that causes a computer to perform processes of: heating a substrate held on a substrate mounting stand; supplying a gas to the substrate via a gas rectifying part; and maintaining a pressure inside a heat insulating part installed between the sealing part installed around the gas rectifying part and an upstream side surface of the gas rectifying part.

According to the present disclosure in some embodiments, there may be provided a substrate processing apparatus, a gas rectifying part, a method of manufacturing a semiconductor device and a program, which may improve at least the processing uniformity for a substrate.

While certain embodiments have been described, these embodiments have been presented by way of example only, and are not intended to limit the scope of the disclosures. Indeed, the methods and apparatuses described herein may be embodied in a variety of other forms; furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A substrate processing apparatus comprising:
a process chamber configured to process a substrate;
a substrate mounting stand installed in the process chamber and configured to hold the substrate;
a heating part configured to heat the substrate embedded on the mounting stand;
a gas rectifying part facing the process chamber and installed in an upper portion of the process chamber, and configured to supply a process gas to the substrate;
a sealing part installed between the gas rectifying part and a gas introduction part;
a heat insulating part installed between the sealing part and an upstream side surface, which faces the processing chamber, and located inside of the gas rectifying part, and having an annular groove shape, an inside of the annular grove shape heat insulating part configured to be vacuum exhausted;
a first pressure adjusting part connected to the heat insulating part, and configured to maintain a pressure inside the heat insulating part at a first predetermined pressure; and
a control part configured to control the first pressure adjusting part.

2. The substrate processing apparatus of claim 1, further comprising:
a cooling channel configured to cool down the sealing part; and
a cooling part configured to supply a refrigerant into the cooling channel,
wherein the control part is configured to control the first pressure adjusting part and the cooling part to maintain a temperature of the upstream side surface at a predetermined temperature.

3. The substrate processing apparatus of claim 1, wherein the gas rectifying part is configured to have a diameter widening toward an outer periphery of the substrate, the gas rectifying part includes a gas channel via which the gas passes, and the upstream side surface is installed at a surface of an upstream side of the gas channel.

4. The substrate processing apparatus of claim 3, wherein the heat insulating part is installed to surround the upstream side of the gas channel.

5. The substrate processing apparatus of claim 1, wherein an exhaust part is installed at an outer periphery of the gas rectifying part, the exhaust part is configured to exhaust an atmosphere in the process chamber, and the exhaust part includes a second heat insulating part at an outer periphery thereof.

6. The substrate processing apparatus of claim 5, wherein a second pressure adjusting part is connected to the second heat insulating part, and
the control part is configured to control the second pressure adjusting part to maintain a pressure inside the second heat insulating part at a second predetermined pressure.

7. The substrate processing apparatus of claim 6, wherein a second heating part is installed between the second heat insulating part and the exhaust part, and
the control part is configured to control the second heating part and the second pressure adjusting part to maintain a temperature of the second heat insulating part at a predetermined temperature.

8. The substrate processing apparatus of claim 1, further comprising a gas supply part configured to supply a gas to the gas rectifying part, wherein the control part is configured to control the gas supply part to sequentially supply the process gas and a reaction gas.

* * * * *